US006996007B2

(12) United States Patent
Ahn et al.

(10) Patent No.: US 6,996,007 B2
(45) Date of Patent: Feb. 7, 2006

(54) APPARATUS AND METHOD OF DRIVING NON-VOLATILE DRAM

(75) Inventors: Jin-Hong Ahn, Ichon-shi (KR); Sang-Hoon Hong, Ichon-shi (KR); Young-June Park, Ichon-shi (KR); Sang-Don Lee, Ichon-shi (KR); Yil-Wook Kim, Ichon-shi (KR); Gi-Hyun Bae, Ichon-shi (KR)

(73) Assignee: Hynix Semiconductor, Inc., (KR)

( * ) Notice: Subject to any disclaimer, the term of this patent is extended or adjusted under 35 U.S.C. 154(b) by 149 days.

(21) Appl. No.: 10/749,356

(22) Filed: Dec. 31, 2003

(65) Prior Publication Data

US 2005/0041474 A1 Feb. 24, 2005

(30) Foreign Application Priority Data

Aug. 22, 2003 (KR) ...................... 10-2003-0058300
Sep. 17, 2003 (KR) ...................... 10-2003-0064354

(51) Int. Cl.
*G11C 16/00* (2006.01)

(52) U.S. Cl. ............. 365/185.08; 365/149; 365/185.18

(58) Field of Classification Search ............ 365/185.08
See application file for complete search history.

(56) References Cited

U.S. PATENT DOCUMENTS 4,545,035 A * 10/1985 Guterman et al. ..... 365/185.08
5,043,946 A * 8/1991 Yamauchi et al. ..... 365/185.08
5,251,171 A * 10/1993 Yamauchi .............. 365/185.08
6,009,011 A * 12/1999 Yamauchi .............. 365/185.01

* cited by examiner

*Primary Examiner*—Tan T. Nguyen
(74) *Attorney, Agent, or Firm*—Blakely Sokoloff Taylor & Zafman

(57) ABSTRACT

A unit cell included in a non-volatile dynamic random access memory (NVDRAM) includes a control gate layer coupled to a word line; a capacitor for storing data; a floating transistor for transmitting stored data in the capacitor to a bit line, gate of the floating transistor being a single layer and serving as a temporary data storage; and a first insulating layer between the control gate layer and the gate of the floating transistor, wherein a voltage supplied to body of the floating transistor is controllable.

24 Claims, 10 Drawing Sheets

APPARATUS AND METHOD OF DRIVING NON-VOLATILE DRAM

FIELD OF INVENTION

The present invention relates to a semiconductor memory device; and, more particularly, to an apparatus and method of driving a non-volatile dynamic random access memory.

DESCRIPTION OF PRIOR ART

In general, a semiconductor memory device can be classified into a random access memory (hereinafter, referred as RAM) and a read only memory (hereinafter, referred as ROM). The RAM is volatile, where as the ROM is non-volatile. Namely, the ROM can keep stored data even though power supply is removed, but the RAM cannot keep stored data if the power supply is removed.

A plurality of RAMs, which take advantage of the ability of field effect transistors to store charge, have evolved and thus serve as memory cells. Such cells may be either dynamic or static in nature. As well know, the dynamic cells may employ only a single field effect transistor and the static cells may be arranged in a flip-flop configuration. These types of the cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

FIG. 1 is a schematic diagram showing a dynamic cell in a conventional volatile dynamic RAM device.

As shown, a capacitor Cap is used for storing data, i.e., logic high or low data '1' or '0'. When a MOS transistor MOS is turned on by a word line voltage Vg, the capacitor Cap is charged or discharged in response to a bit line voltage Vbl. If the bit line voltage Vbl is in logic high, the capacitor Cap is charged, i.e., stores '1'. If otherwise, the capacitor Cap is discharged, i.e., stores '0'. Herein, a plate line of the capacitor Cap is supplied with a plate line voltage Vcp. In general, the plate line voltage Vcp is 0 V or a half of the supply voltage.

Meanwhile, in order to hold information without the alternate power supply, known devices capable of providing variable threshold voltages, such as field effect transistors having metal-nitride-oxide-silicon (MNOS) and field effect transistors having a floating gate, are also capable of storing information in a non-volatile manner for long periods. By incorporating such non-volatile devices into memory cells, there have been provided normally operating volatile cells which do not require a backup or an alternate power supply for preserving information when a power interruption or failure occurs in the main power supply.

The non-volatile memory cells which use non-volatile MNOS transistors or relevant devices are capable of retaining information stored volatilely in a cell for moderate periods of time. However, these devices require high voltage pulses for writing and erasing the information.

Hereinafter, referring to U.S. patents, the conventional non-volatile dynamic cell will be described in detail.

For example, commonly assigned U.S. Pat. No. 3,916,390, issued on Oct. 28, 1975 to J. J. Chang and R. A. Kenyon and entitled "DYNAMIC MEMORY WITH NON-VOLATILE BACK-UP MODE", discloses the use of a dual insulator made of silicon dioxide and silicon nitride for storing information non-volatilely during power failure. Other examples of the dynamic cells capable of storing information non-volatilely by using MNOS structures include U.S. Pat. No. 4,055,837, issued on Oct. 25, 1977 to K. U. Stein et al and entitled "DYNAMIC SINGLE-TRANSISTOR MEMORY ELEMENT FOR RELATIVELY PERMANENT MEMORIES", and U.S. Pat. No. 4,175,291, issued on Nov. 20, 1979 to W. Spence and entitled "NON-VOLATILE RANDOM ACCESS MEMORY CELL". These dynamic cells having non-volatile capability can operate satisfactorily. However, they generally require larger cell areas, larger voltages for a volatile operating mode or backup memory.

In U.S. Pat. No. 4,471,471, issued on Sep. 11, 1984 to DiMaria and Donelli J. and entitled "NON-VOLATILE RAM DEVICE", there is provided a non-volatile dynamic random access memory (NVDRAM) having a multiplicity of floating gate in a field effect transistor DRAM characterized by a non-volatile memory. The NVDRAM uses the floating gate for storing information non-volatilely during a power failure and utilizes a double electron injector structure (DEIS) stack over the transfer gate for data recovery after resumption of power. A main disadvantage of this cell is that data cannot be transferred from a capacitor to a floating gate in parallel in all cells since the DEIS stack is located on the bit line side of the cell. The data first has to be read out by turning on the transfer transistor and sensing a voltage supplied on the bit line.

For solving the above disadvantage, U.S. Pat. No. 5,331,188, issued on Jul. 19, 1994 to Acovic et al. and entitled "NON-VOLATILE DRAM CELL", discloses a compact one-transistor non-volatile DRAM cell and a method for fabricating same. In the Acovic et al., the DRAM cell has a tunnel oxide or dual electron injector structure disposed between a storage node and a floating gate for non-volatile data retention during power interruptions in a compact one transistor structure.

However, a plate line voltage of a capacitor in the above DRAM cell is coupled to a ground voltage. An electric filed of the capacitor is generated by only a voltage supplied to a word line and a bit line. Therefore, the floating gate should include two layers and the size of the DRAM cell should be increased. Also, a method and process for fabricating the DRAM cell may be more complex. In comparison with a DRAM cell of which a plate line voltage can be adjusted, the NVDRAM may consume larger power because the word line and the bit line should be supplied with a relatively high voltage.

SUMMARY OF INVENTION

It is, therefore, an object of the present invention to provide an apparatus and method of driving a non-volatile dynamic random access memory (NVDRAM) having a DRAM cell of which a plate line voltage can be adjusted.

In accordance with an aspect of the present invention, there is provided a unit cell included in a non-volatile dynamic random access memory (NVDRAM) includes a control gate layer coupled to a word line; a capacitor for storing data; a floating transistor for transmitting stored data in the capacitor to a bit line, gate of the floating transistor being a single layer and serving as a temporary data storage; and a first insulating layer between the control gate layer and the gate of the floating transistor, wherein a voltage supplied to body of the floating transistor is controllable.

In accordance with another aspect of the present invention, there is provided a unit cell included in a non-volatile dynamic random access memory (NVDRAM) including a control gate layer made of a metal and coupled to a word line; a capacitor for storing data; and a floating transistor for transmitting stored data in the capacitor to a bit line, gate of the floating transistor being a single nitride layer and serving as a temporary data storage, wherein a voltage supplied to body of the floating transistor is controllable.

In accordance with another aspect of the present invention, there is provided a non-volatile dynamic random access memory (NVDRAM) device for controlling a unit cell including an internal voltage generator for receiving an external voltage and generating a plurality of internal voltages having each different level; a switching block for supplying one of the plurality of internal voltages to a word line, a bit line and a capacitor plate line; and a mode controller for controlling the switching block.

In accordance with another aspect of the present invention, there is provided a method for operating a non-volatile dynamic random access memory (NVDRAM) device including a plurality of memory cells, each cell having a capacitor and a transistor having a floating gate, including the steps of: (A) charging the capacitors of all memory cell with a logic HIGH datum; and (B) discharging the capacitor in the memory cell having the transistor, its floating gate storing a logic high datum.

In accordance with another aspect of the present invention, there is provided a method for operating a non-volatile dynamic random access memory (NVDRAM) device including a plurality of memory cells, each cell having a capacitor and a transistor having a floating gate, including the steps of: (A) supplying a word line with a voltage defined by the following equation: $V_{wl}=V_{blp}+(V_{th-H}+V_{th-L})/2$ where $V_{blp}$ is a bit line precharge voltage, $V_{th-H}$ is a first target threshold voltage, and $V_{th-L}$ is a second target threshold voltage; and (B) writing logic HIGH or LOW data in the capacitor in response to whether the threshold voltage is the $V_{th-H}$ or the $V_{th-L}$.

In accordance with another aspect of the present invention, there is provided a method for operating a non-volatile dynamic random access memory (NVDRAM) device including a plurality of memory cells, each cell having a capacitor and a transistor having a floating gate, including the steps of: (A) supplying all gates of the transistors in all of the memory cells with a first predetermined voltage in order for fulfilling electrons in the floating gate; (B) charging all of the capacitors in all of the memory cells; (C) decreasing the threshold voltage of the transistors to the first threshold voltage.

In accordance with another aspect of the present invention, there is provided a method for operating a non-volatile dynamic random access memory (NVDRAM) device including a plurality of memory cells, each cell having a capacitor and a transistor having a floating gate, including the steps of: (A) removing electrons in the floating gate of the memory cell storing a logic HIGH datum; (B) discharging the capacitor by supplying gate of the transistor in all of the memory cells with a second threshold voltage; and (C) repeating the steps (A) to (B) until all of the capacitors is discharged.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF INVENTION

Hereinafter, a non-volatile dynamic random access memory (NVDRAM) device will be described in detail with reference to the accompanying drawings.

Figure 1:
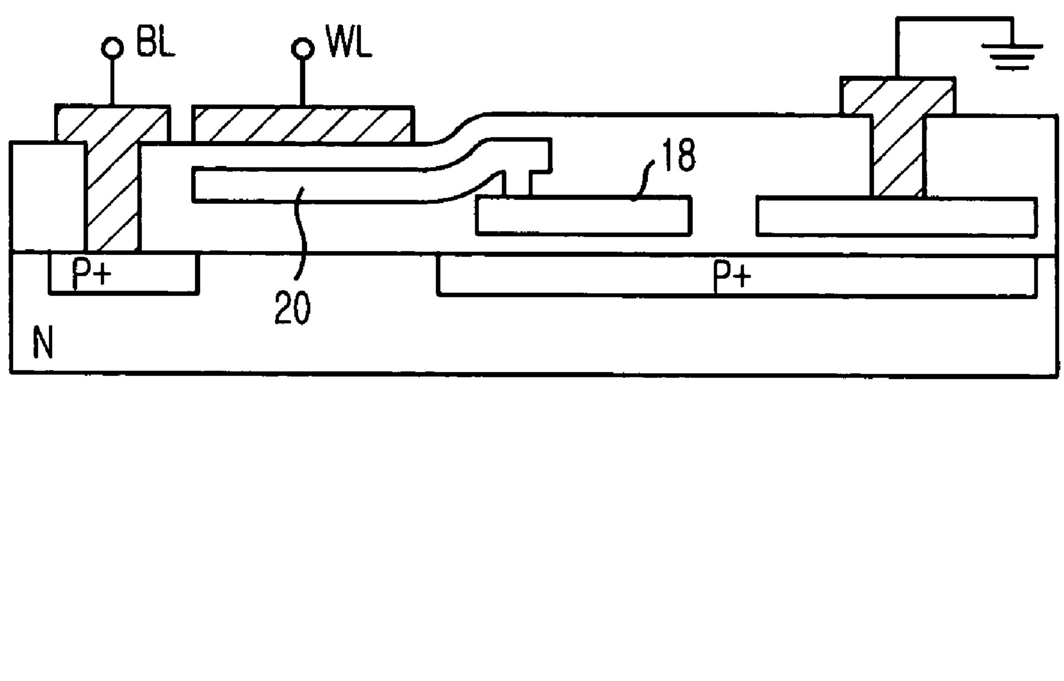
FIG. 1 is a cross-sectional view depicting a unit cell of a non-volatile dynamic random access memory (NVDRAM) in accordance with the prior art.
Figure 2A:
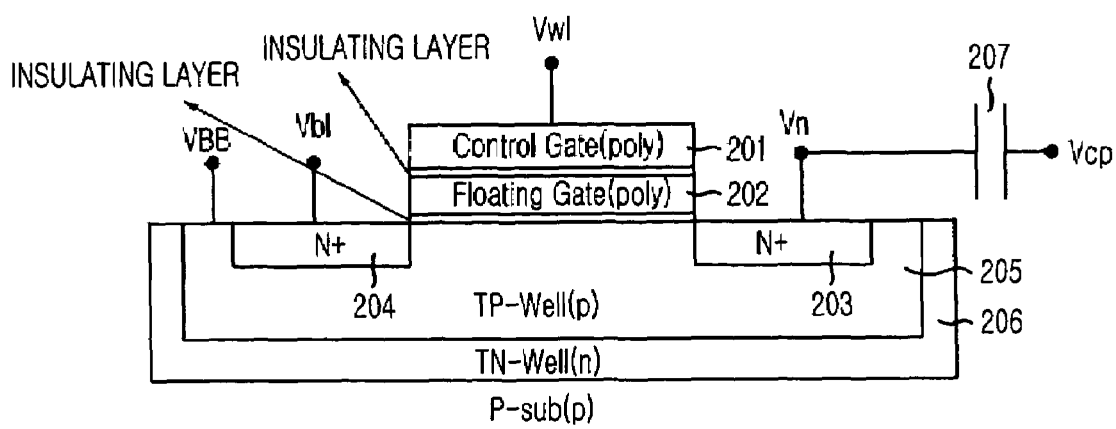
FIG. 2A is a cross-sectional view showing a unit cell of a NVDRAM in accordance with an embodiment of the present invention.
Figure 2B:
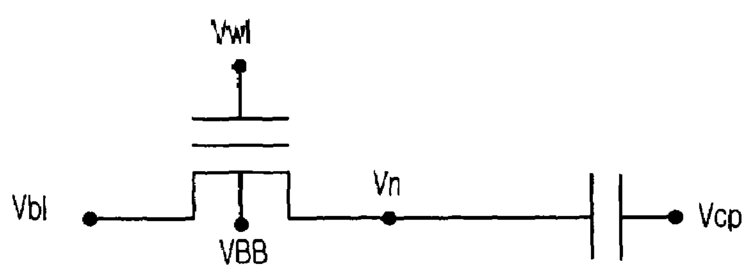
FIG. 2B is a schematic diagram describing the unit cell of the NVDARM shown in FIG. 2A.

FIG. 2A is a cross-sectional view showing a unit cell of a NVDRAM in accordance with an embodiment of the present invention. FIG. 2B is a schematic diagram describing the unit cell of the NVDARM shown in FIG. 2A.

As shown in FIG. 2A, a DRAM cell generally includes a floating transistor and a capacitor 207. However, the unit cell of the NVDRAM further includes a control gate 201 on a gate 202 of the floating transistor. Hereinafter, the gate of the floating transistor is referred to a floating gate.

In the present invention, the floating gate 202 is provided with a single layer. Also, a plate line of the capacitor 207 is supplied with a plate line voltage $V_{cp}$, not a ground voltage. As a result, a size of the unit cell can be decreased. Also, a method and process of fabricating the unit cell is more simplified. Moreover, because the capacitor 207 is supplied with a controllable plate line voltage, the NVDRAM can be operated by inputting a relatively low voltage at a word line and a bit line coupled to the unit cell. Namely, the NVDRAM of the present invention can reduce power consumption.

Herein, referring to FIG. 2A, the control gate 201 and the floating gate 202 are made of a poly-silicon; and an insulating layer is located between the control gate 201 and the floating gate 202.

Figure 3A:
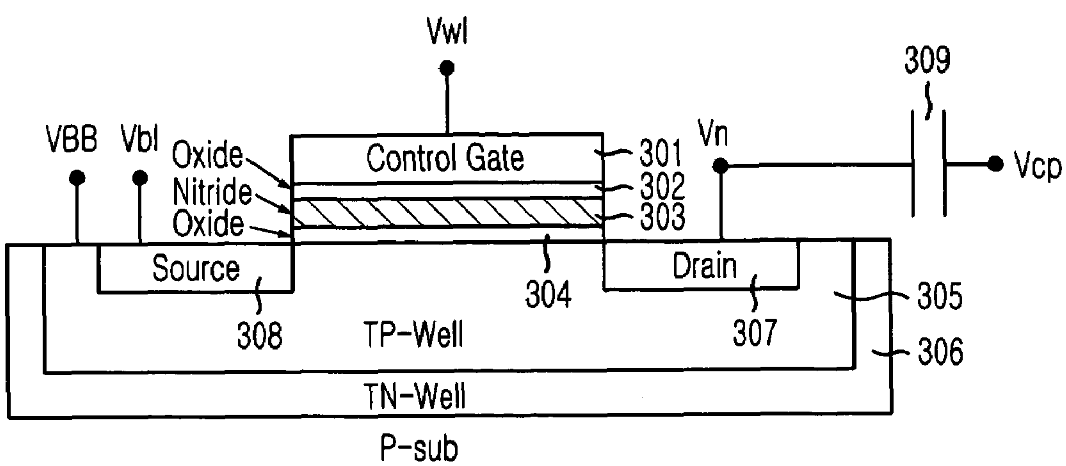
FIG. 3A is a cross-sectional view depicting a unit cell of a NVDRAM in accordance with another embodiment of the present invention.
Figure 3B:
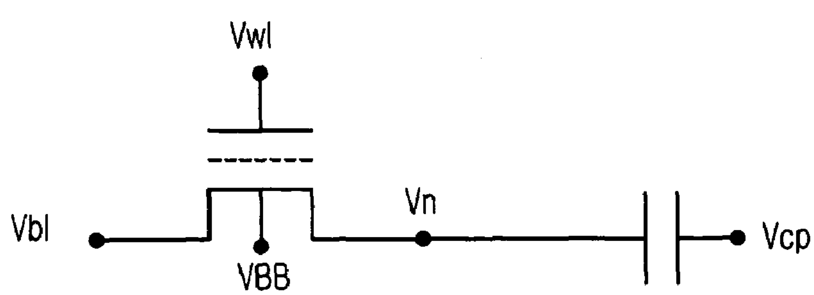
FIG. 3B is a schematic diagram showing the unit cell of the NVDARM shown in FIG. 3A.

FIG. 3A is a cross-sectional view depicting a unit cell of a NVDRAM in accordance with another embodiment of the present invention. FIG. 3B is a schematic diagram showing the unit cell of the NVDARM shown in FIG. 3A.

Referring to FIG. 3A, a floating gate 303 is made of a nitride layer. Namely, the unit cell has a silicon-oxide-nitride-oxide-silicon (SONOS) structure 301 to 305. However, if a control gate 301 is made of a metal, a first oxide insulating layer 302 is unnecessary. Thus, the unit cell can have a metal-nitride-oxide-silicon (MNOS) structure.

Figure 4:
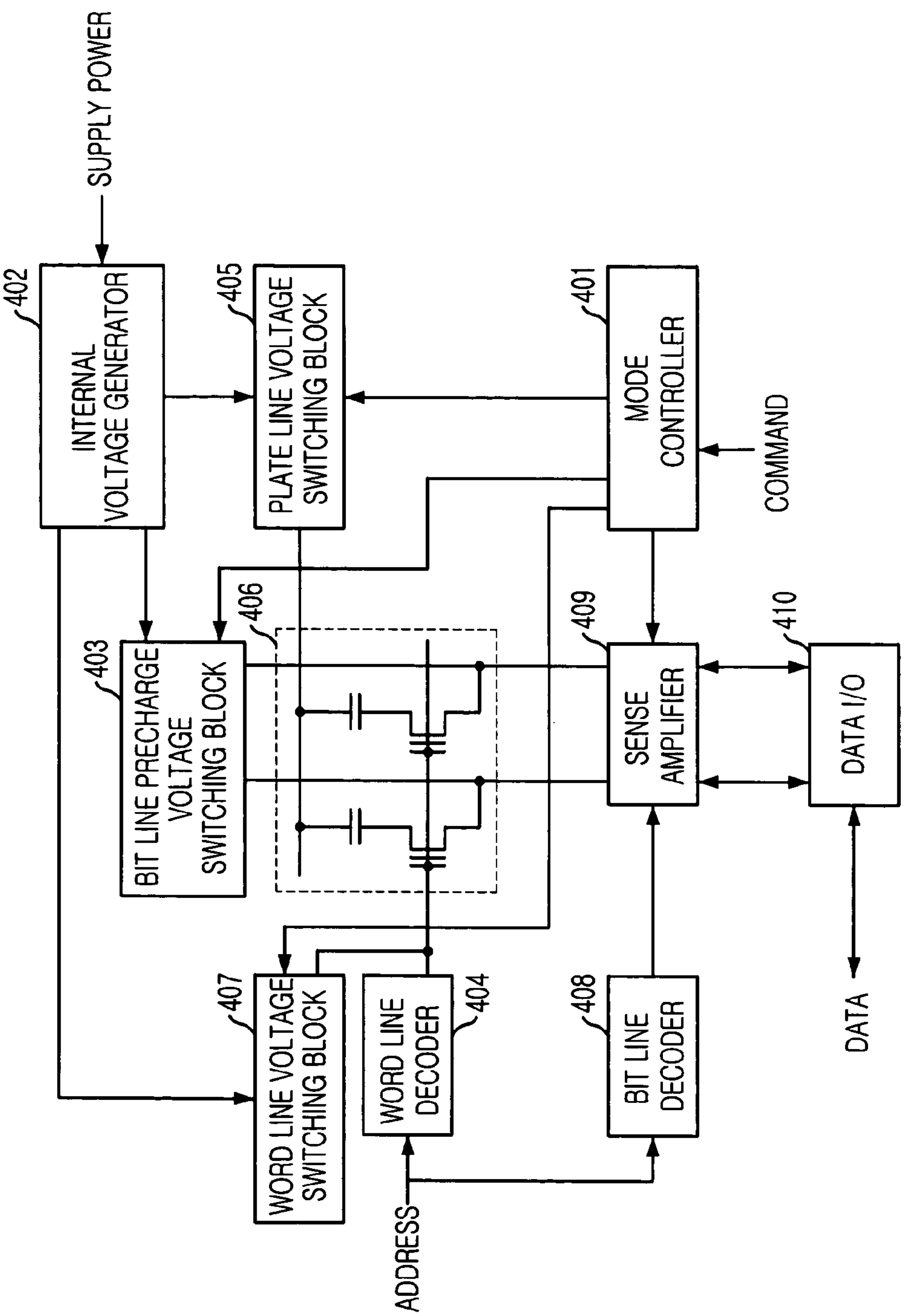
FIG. 4 is a block diagram describing a bank of a NVDRAM in accordance with another embodiment of the present invention.

FIG. 4 is a block diagram describing a bank of a NVDRAM in accordance with another embodiment of the present invention.

The segment includes a mode controller 401, an internal voltage generator 402, a bit line precharge voltage switching block 403, a word line decoder 404, a plate line voltage switching block 405, a cell block 406, a word line voltage switching block 407, a bit line decoder 408, a sense amplifier 409 and a data input/output buffer 410.

Herein, there are omitted detailed descriptions about general blocks, i.e., operation blocks in a general DRAM. For example, the bit line decoder 404 and the word line decoder 408 is generally used in the general DRAM. Thus, descriptions of the bit line decoder 404, the data input/output buffer 410, the sense amplifier 409, the cell block 406 and the word line decoder 408 are omitted. But, each unit cell in the cell block 406 is a non-volatile memory cell such a unit cell shown in FIG. 2A or 3A.

In the bank, a circuit for driving a plurality of memory cell block including a plurality of unit cells in a non-volatile dynamic random access memory (NVDRAM) includes an internal voltage generator 402 for receiving an external voltage and generating a plurality of internal voltages having each different level; a switching block for supplying one of the plurality of internal voltages to a word line, a bit line and a capacitor plate line; and a mode controller 401 for controlling the switching blocks. Herein, the switching block includes a word line voltage switch block 407 for supplying one of the plurality of internal voltages to the word line; a bit line precharge voltage switch block 403 for supplying one of the plurality of internal voltages to the bit line; and a plate line voltage switch block 405 for supplying one of the plurality of internal voltages to the capacitor plate line.

Hereinafter, an operation of the NVDRAM including the plurality of unit cells having a floating gate made of the poly-silicon is described in detail. In case When the NVDRAM includes the plurality of unit cells having the SONOS or MNOR structure, there is described a difference of the operation.

The NVDRAM holds data in each cell if the external voltage is isolated; otherwise, the NVDRAM operates as a volatile DRAM if the external voltage is supplied. Therefore, in the NVDRAM of the present invention, the operational mode includes four modes: a recall mode, a normalization mode, a DRAM mode and a program mode.

In the recall mode, for delivering data stored in the floating gate 303 to the capacitor Cap when the external voltage is supplied, it is checked whether a threshold voltage of each memory cell is a first threshold voltage $V_{Hth}$ or a second threshold voltage $V_{Lth}$ for turning on the transistor. Herein, the first threshold voltage $V_{Hth}$ means that the floating gate has electrons, i.e., stores a logic LOW datum; and the second threshold voltage $V_{Lth}$ means that the floating gate does not have any electron, i.e., stores a logic HIGH datum. That is, the first threshold voltage $V_{Hth}$, e.g., 1 V is higher than the second threshold voltage $V_{Lth}$, e.g., 0 V.

More specifically, as shown in FIG. 4A, gate of each transistor in all of the memory cells is supplied with a higher voltage, e.g., 4V in order to turn on the transistor. Then, all of bit lines are supplied with a supply voltage VDD and, as a result, the logic HIGH datum is written in all of memory cells. That is, the logic HIGH datum is stored in the capacitor Cap of all the memory cells.

Thereafter, the gate of each transistor is supplied with the second threshold voltage $V_{Lth}$. Then, in some of the memory cells having the transistor turned on by the second threshold voltage $V_{Lth}$, the capacitor Cap is discharged. However, in the other of the memory cells, i.e., each having the transistor which is not turned on by the second threshold voltage $V_{Lth}$, the capacitor Cap is not discharged.

Namely, if the threshold voltage of the transistor in the memory cell is higher than the second threshold voltage $V_{Lth}$, the capacitor Cap in the same memory cell stores the logic HIGH datum. However, if otherwise, the capacitor Cap stores the logic LOW datum.

As described above, after the recall mode is performed, the capacitor Cap stores an inverse data of the original data. Therefore, the inverse data stored in the capacitor Cap should be turned back to the original data. In the present invention, the normalization mode includes the step of turning back the inverse data to the original data.

In the other hand, at another example of the recall mode, the data can be stored in the capacitor Cap without a data conversion.

First, one selected word line is supplied with a word line voltage derived by the following equation Eq-1.

$$V_{wl}=V_{blp}+(V_{th\text{-}H}+V_{th\text{-}L})/2 \quad \text{[Eq-1]}$$

Herein, '$V_{blp}$' is a bit line precharge voltage when the NVDRAM device operates as a volatile DRAM. '$V_{Hth}$' is the first threshold voltage of the memory cell having the logic LOW data when the NVDRAM operates in the program mode, and '$V_{Lth}$' is the second target threshold voltage of the cell having the logic LOW data when the NVDRAM device operates in the program mode. In addition, other word lines except for the selected word line are supplied with a predetermined negative voltage in order to protect a voltage leakage between the capacitor and the bit line.

Thereafter, the above process is performed in all the word lines of the cell block sequentially. As a result, each capacitor Cap can store the logic HIGH or LOW data by a potential difference between the first and second threshold voltages $V_{Hth}$ and $V_{Lth}$. The data stored in the capacitor is defined as the following equation Eq-2.

$$V_{wl}=V_{blp}\pm(V_{Hth}-V_{Lth})/2 \quad \text{[Eq-2]}$$

Herein, the above denotations express the same in Eq-1.

Next, all of the memory cells are refreshed by supplying the word line with a higher voltage than the logic HIGH datum voltage. Then, a normal datum, i.e., the unconverted datum is stored in the capacitor Cap.

Figure 6:
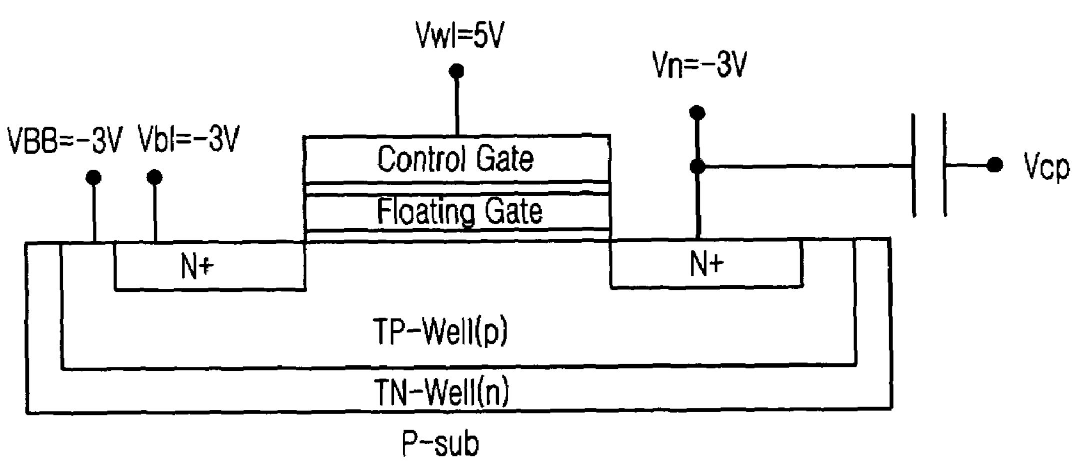
FIG. 6 is a cross-sectional view depicting the normalization mode of the NVDRAM device shown in FIG. 3A.

FIG. 6 is a cross-sectional view depicting the normalization mode of the NVDRAM device shown in FIG. 3A.

After the recall mode is carried out, the threshold voltage of the transistor in each memory cell is different because of datum stored in the floating gate 32. It is because the threshold voltage of the transistor is based on a datum, i.e., the logic HIGH datum or the logic LOW datum stored in the floating gate of the memory cell. Herein, the normalization mode is for setting up the threshold voltage of the transistor in all of the memory cells to the first threshold voltage $V_{Hth}$.

In first step, data stored in each capacitor Cap of all memory cells are backed up respectively.

In second step, as shown in FIG. 6, all of the word lines, i.e., gates of the transistors in all of the memory cells are supplied with above 5 V; and the bit lines and the bodies of all memory cells are supplied with about −3 V. Then, electrons under the second insulating layer 31 are moved to the floating gate 32. Thus, each memory cell has a threshold voltage, which turns on the transistor, higher than the first threshold voltage $V_{Hth}$ (shown in FIG. 7).

Figure 7:
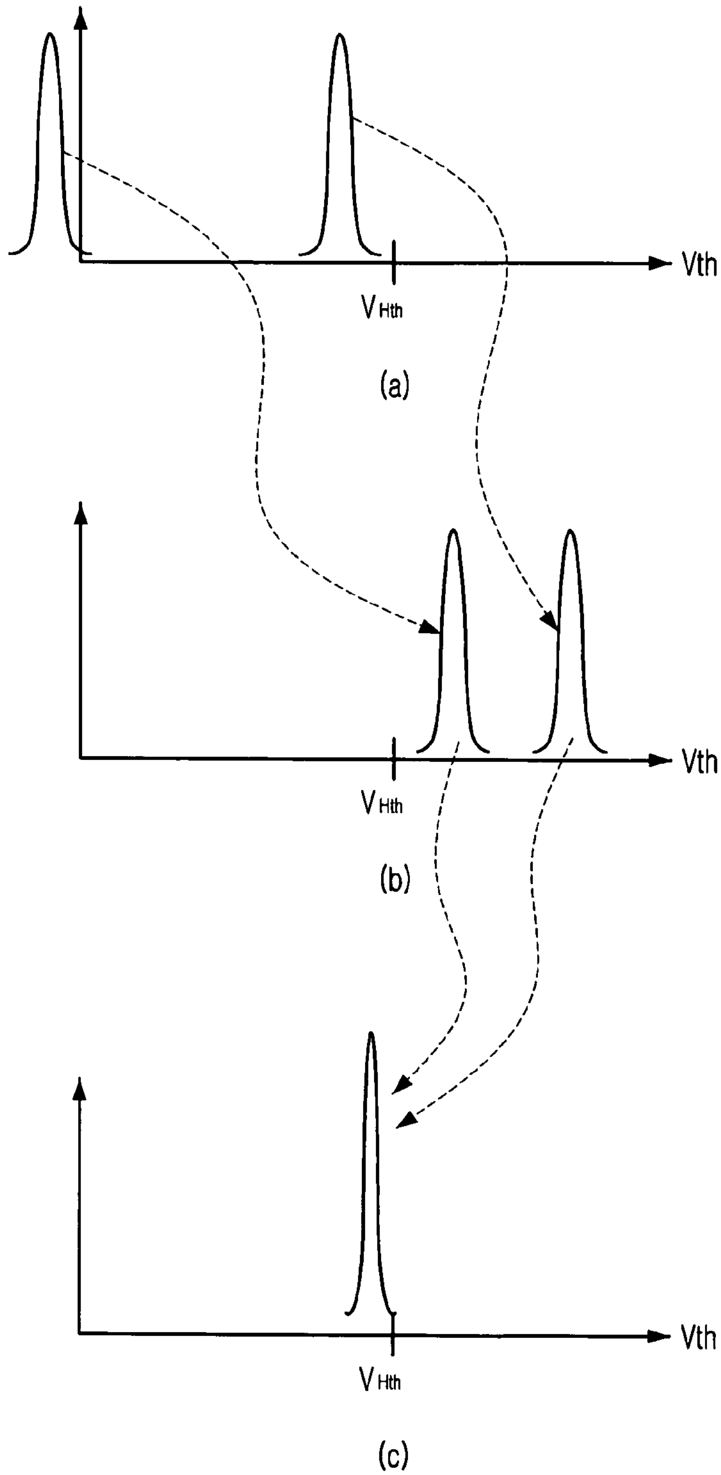
FIG. 7 is graphs describing the threshold voltage of the floating gate in a normalization mode of the NVDRAM shown in FIG. 3A.

FIG. 7 is graphs describing the threshold voltage of the floating gate in the normalization mode of the NVDRAM device shown in FIG. 3A. In detail, FIG. 7 is graphs describing the third threshold voltage of a floating gate in the memory cell. As shown in (*a*), the threshold voltage is illustrated before the floating gate is supplied with any charge. Also, as shown in Fig. (*b*), the threshold voltage is illustrated after the floating gate is supplied with any charge. Referring to FIGS. 7 (*a*) and (*b*), each memory cell has a higher threshold voltage than the first target threshold voltage $V_{th\text{-}H}$.

In third step, the capacitors Caps of all the memory cells are charged by supplying the logic HIGH datum in all of the bit lines coupled to all of the memory cells when the gates of the transistors is supplied with about 5 V. Then, the capacitors Caps are charged with the logic HIGH datum.

Meanwhile, the capacitors can be charged by writing the logic HIGH data in all memory cells after a bit line supplied voltage $V_{bl}$ is increased to the logic HIGH data voltage.

Figure 8:
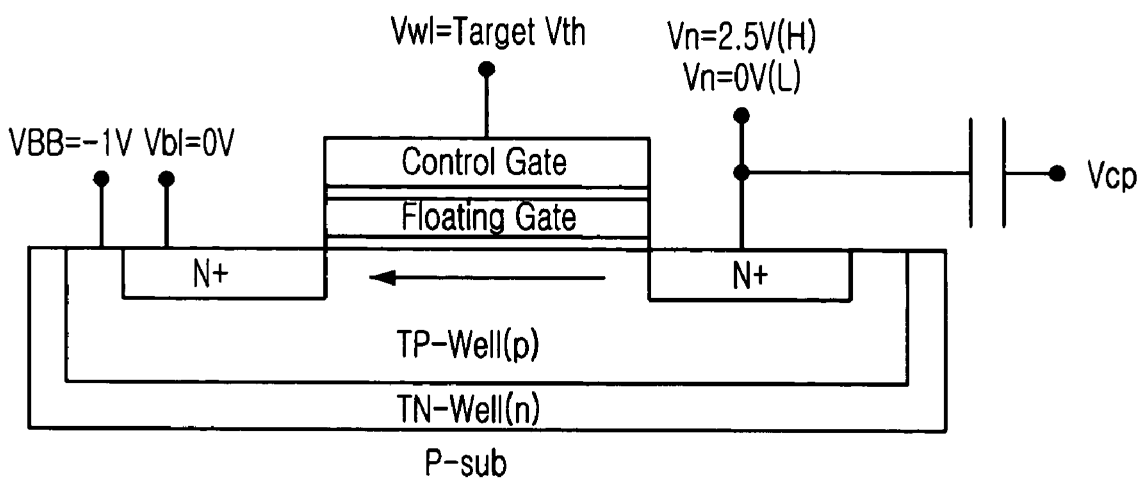
FIG. 8 is a cross-sectional view depicting a bias condition of the unit cell in the normalization mode of the NVDRAM shown in FIG. 3A.
Figure 9:
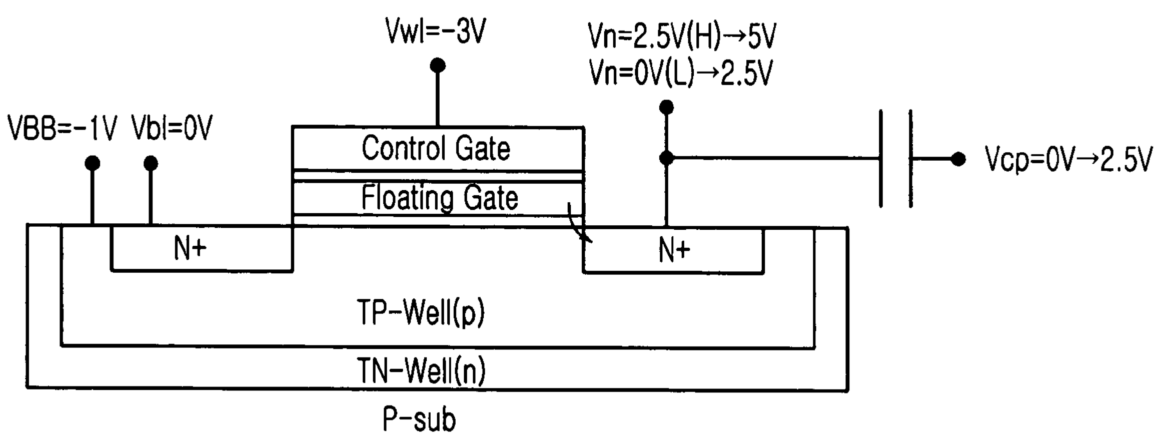
FIG. 9 is a cross-sectional view depicting a bias condition of the unit cell in the normalization mode of the NVDRAM shown in FIG. 3A.

FIGS. 8 and 9 are cross-sectional views depicting a bias condition of the unit cell in the normalization mode of the NVDRAM device shown in FIG. 3A.

In fourth step, the threshold voltage of each memory cell is decreased to the first threshold voltage $V_{Hth}$, i.e., 1 V. In detail, the fourth step includes the following steps: (a) removing electrons in the floating gate of the memory cells; (b) discharging the capacitor Cap by supplying gate of the transistor in the memory cells with the first threshold voltage $V_{Hth}$; and repeating the steps (a) and (b) until all of the capacitors Caps is discharged.

Figure 5:
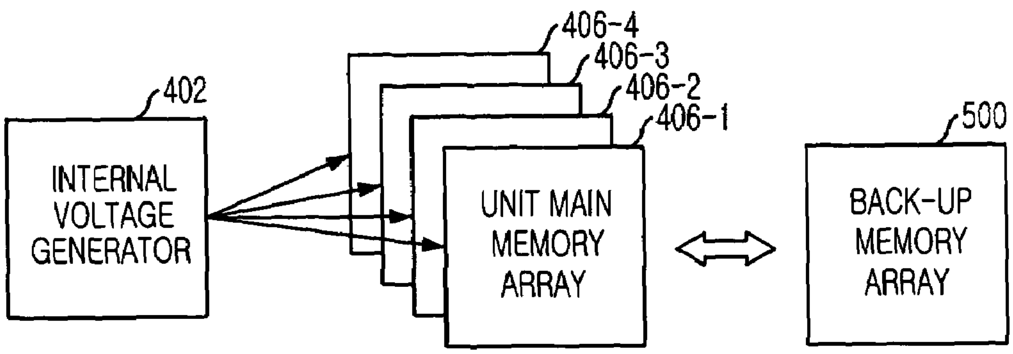
FIG. 5 is a block diagram showing a NVDRAM having a back-up memory array in accordance with another embodiment of the present invention.

For instance, referring to FIG. 5C, the word line voltage is supplied with the first threshold voltage $V_{Hth}$, e.g., 1.0 V and the bit line is supplied with about 0 V. Then, if the threshold voltage of the memory cell is lower than the first threshold voltage $V_{Hth}$, the transistor of the memory cell is turned on and the capacitor Cap of the memory cell is discharged. However, if the threshold voltage is higher than the first threshold voltage $V_{Hth}$, the capacitor Cap is not discharged.

In the step (a) of the fifth step, referring to FIG. 5D, the word line is supplied with a negative voltage, e.g., −3 V; the bit line is supplied with 0 V; the bulk is supplied with −3 V; and the plate line of the capacitor Cap is supplied gradually from about 0V to above about 2.5V. Herein, the capacitor Cap is a coupling capacitor, i.e., a voltage level of the one side is in response to a voltage level of the other side if the capacitor is not discharged and the voltage gap between sides of the capacitor is kept. Then, a voltage level of a storage node in a memory cell storing the logic HIGH data increases to about 5V and a storage node voltage of a memory cell storing the logic LOW data keeps about 2.5V. Herein, the storage node Vn is between the capacitor Cap and the transistor in the memory cell. As a result, a potential difference between the storage node and the control gate is about 8V. The potential difference is enough to delivers electrons stored in the floating gate 32 to the capacitor Cap. Then, the threshold voltage is gradually decreased until the threshold voltage is the first target threshold voltage $V_{Hth}$ (shown in FIG. 5D).

Thereafter, the gate of the transistor is supplied with the first threshold voltage $V_{Hth}$, i.e., 0 V. If the threshold voltage is decreased to the first threshold voltage $V_{Hth}$, the capacitor Cap is discharged; however, if not, the capacitor Cap is not discharged. If the capacitor Cap is not discharged, the gate of the transistor is supplied with the negative voltage, i.e., −3 V. Then, electrons stored in the floating gate 32 are moved to the capacitor Cap. In all of the memory cells, the process described above is repeated until the capacitor Cap is discharged.

Furthermore, all of the memory cells can be refreshed for clarifying the stored data, before the gate of the transistor is supplied with the negative voltage since the gate of the transistor is supplied with the first threshold voltage $V_{Hth}$.

In the other hand, the process is repeated because the capacitance of the capacitor Cap is not enough to receive the charges outputted from the floating gate. Herein, one cycle of the repeated process in the present invention is defined as a stress-refresh-check (SRC) process.

Figure 10:
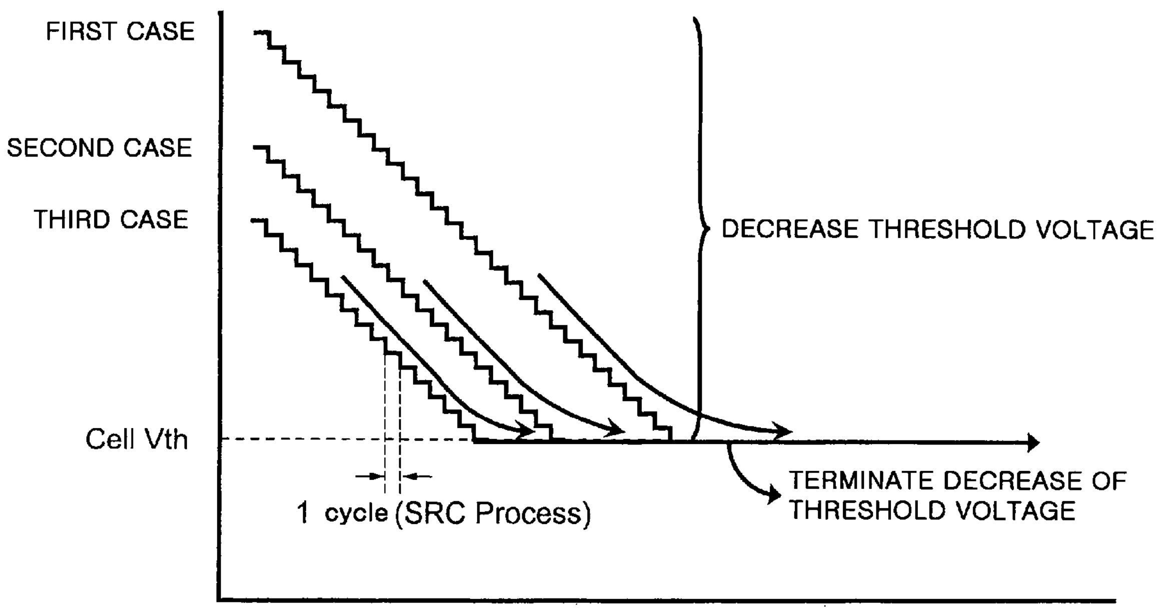
FIG. 10 is a graph demonstrating the normalization mode of the NVDRAM shown in FIG. 3A.

FIG. 10 is a graph demonstrating the normalization mode of the NVDRAM shown in FIG. 3A.

In the SRC process, the third threshold voltage in the memory cell storing the logic LOW data converted from the logic HIGH data in the forth step is protected from being lower than the target threshold voltage because charges are not moved in the fifth step. This operation is defined as a threshold voltage clamping.

Finally, in an eighth step (not shown), the back-up data are recovered into the original cells. Herein, the data converted by the recall mode can be turned back to the original by using an inverter when the data are backed up or recovered.

Meanwhile, in the NVDRAM device having the SONOS structure, charges are captured in not the whole nitride layer 32 but in sides of the nitride layer 32 closed to the source 35 and the drain 36. Herein, the charges captured in one side of the nitride layer 32 closed to the source 35 should be discharged. Thus, between the second and third steps, the word line is supplied with about −3 V and the bit line is supplied with about 5 V.

In the normal DRAM mode, the NVDRAM device operates as a volatile DRAM, thus description about an operation of the normal DRAM mode is omitted.

Figure 11:
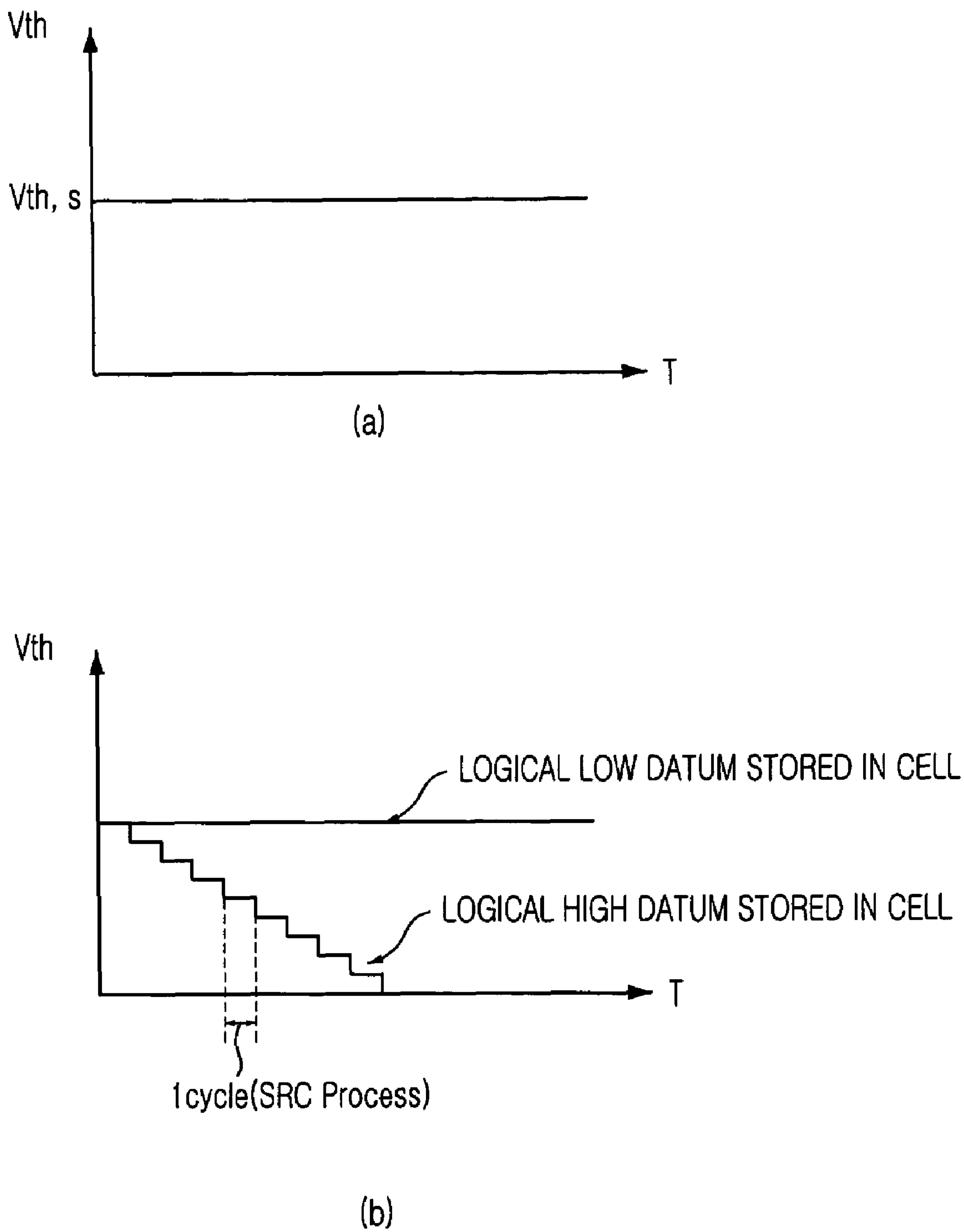
FIG. 11 is a graph describing the threshold voltage in the program mode of the NVDRAM shown in FIG. 3A.

FIG. 11 is a graph describing the threshold voltage in the program mode of the NVDRAM device shown in FIG. 3A.

If the external voltage is unstable or isolated, the program mode for delivering data stored in the capacitor to the floating gate is performed.

In a first step, the plurality of memory cells is refreshed for clarifying stored data.

In a second step, in the memory cell storing the logic HIGH data, the threshold voltage is clamped to the second threshold voltage $V_{Lth}$. For the sake of this step, the word line is supplied with the second threshold voltage $V_{Lth}$, e.g., about 0 V and the bit line is supplied with about 0 V for a predetermined time.

Thereafter, in a third step, in response to the data stored in the plurality of memory cells, the threshold voltage is decreased by selectively discharging charges in each floating gate of the plurality of memory cells. As shown in FIG. 9, the word line is supplied with about −3 V and the plate line of the capacitor is increased from about 0 V to about 2.5 V. As a result, a voltage of the storage node of the memory cell storing the logic HIGH data is about 5 V; and that of the storage node of the memory cell storing the logic LOW data is about 2.5 V. Then, referring to FIG. 11, in only memory cell storing the logic HIGH data, charges captured in the floating gate are discharged to the capacitor Cap, and, thus, the threshold voltage is decreased.

Finally, until all the memory cells store the logic LOW data, the second and third steps are sequentially repeated.

This step is similar to the SRC of the normalization mode. As shown in FIG. 11, after the NVDRAM device operates in the program mode, the threshold voltage of one memory cells storing the logic HIGH data is changed to the second threshold voltage $V_{Lth}$ and the threshold voltage of the other memory cells storing the logic LOW data is not changed.

Consequently, on the basis of the above described preferred embodiments, the NVDRAM device can be controlled by supplying the word line, the bit line and the plate line of the capacitor in the memory cell with each different voltage. More particularly, because the plate line of the capacitor can be supplied with each different voltage in response to the operation mode of the NVDRAM device, the NVDRAM device can be operated by a relatively low internal voltage. As a result, the NVDRAM device can reduce power consumption dramatically.

While the present invention has been described with respect to the particular embodiments, it will be apparent to those skilled in the art that various changes and modifications may be made without departing from the spirit and scope of the invention as defined in the following claims.

What is claimed is:

1. A unit cell included in a non-volatile dynamic random access memory (NVDRAM), comprising:
- a control gate layer coupled to a word line;
- a capacitor for storing data;
- a floating transistor for transmitting stored data in the capacitor to a bit line, gate of the floating transistor being a single layer and serving as a temporary data storage; and
- a first insulating layer between the control gate layer and the gate of the floating transistor,
- wherein a voltage supplied to body of the floating transistor is controllable.

2. A unit cell included in a non-volatile dynamic random access memory (NVDRAM), comprising:
- a control gate layer made of a metal and coupled to a word line;
- a capacitor for storing data; and
- a floating transistor for transmitting stored data in the capacitor to a bit line, gate of the floating transistor being a single nitride layer and serving as a temporary data storage,
- wherein a voltage supplied to body of the floating transistor is controllable.

3. A method for operating a non-volatile dynamic random access memory (NVDRAM) device including a plurality of memory cells, each cell having a capacitor and a transistor having a floating gate, comprising the steps of:
- (A) charging the capacitors of all memory cell with a logic HIGH datum; and
- (B) discharging the capacitor in the memory cell having the transistor, its floating gate storing a logic high datum.

4. The method as recited in claim 3, further comprising the step of (C) refreshing the plurality of capacitors.

5. The method as recited in claim 4, wherein the plurality of the memory cells are arranged in a matrix by using a number of word lines and bit lines and the step (C) is carried out in a row-by-row basis.

6. The method as recited in claim 3, wherein the step (A) includes the steps of:
- (A-1) supplying one word line connected to a multiplicity of the memory cells with a first threshold voltage in order to turn on the transistors in all of the memory cells;
- (A-2) writing the logic HIGH datum in the capacitors of the memory cells coupled to the word line; and
- (A-3) repeating the steps (A-1) and (A-1) until all of the capacitors in the plurality of the memory cells are charged with the logic HIGH datum.

7. A method for operating a non-volatile dynamic random access memory (NVDRAM) device including a plurality of memory cells, each cell having a capacitor and a transistor having a floating gate, comprising the steps of:
- (A) supplying a word line with a voltage defined by the following equation:

$$V_{wl}=V_{blp}+(V_{th\text{-}H}+V_{th\text{-}L})/2$$

- where $V_{blp}$ is a bit line precharge voltage, $V_{th\text{-}H}$ is a first target threshold voltage, and $V_{th\text{-}L}$ is a second target threshold voltage; and
- (B) writing logic HIGH or LOW data in the capacitor in response to whether the threshold voltage is the $V_{th\text{-}H}$ or the $V_{th\text{-}L}$.

8. The method as recited in claim 7, further comprising:
- (C) refreshing the plurality of memory cells by supplying each word line with a voltage which is higher than the logic HIGH datum.

9. The method recited in claim 7, wherein the step (A) includes the step of (A-1) supplying other word lines with a predetermined negative voltage except for the word line supplied with the '$V_{wl}$'.

10. A method for operating a non-volatile dynamic random access memory (NVDRAM) device including a plurality of memory cells, each cell having a capacitor and a transistor having a floating gate, comprising the steps of:
- (A) supplying all gates of the transistors in all of the memory cells with a first predetermined voltage in order for fulfilling electrons in the floating gate;
- (B) charging all of the capacitors in all of the memory cells;
- (C) decreasing the threshold voltage of the transistors to the first threshold voltage.

11. The method as recited in claim 10, further comprising:
- (E) backing up the captured data in the capacitor before the step (A); and
- (F) restoring the backup data in the capacitor after the step (C).

12. The method as recited in claim 10, wherein the step (B) includes the steps of:
- (B-1) supplying one side of the capacitor with about 0 V; and
- (B-2) supplying the bit line with the logic HIGH datum.

13. The method as recited in claim 10, wherein the step (C) includes the steps of:
- (C-1) removing electrons in the floating gate of the memory cells;
- (C-2) discharging the capacitor by supplying gate of the transistor in the memory cells with the first threshold voltage; and
- (C-3) repeating the steps (C-1) to (C-2) until all of the capacitors is discharged.

14. The method as recited in claim 13, wherein the step (C-1) includes the steps of:
- (C-1-a) supplying a gate of the transistor in all of the memory cells with a negative voltage;
- (C-1-b) supplying a plate of the capacitor in the memory cells with voltage level of a logic HIGH datum; and
- (C-1-c) moving electrons in the floating gate to the capacitor storing the logic HIGH datum.

15. The method as recited in claim 13, wherein the step (C-2) includes the steps of:

(C-2-a) supplying the gate of the transistor with a second threshold voltage; and (C-2-b) discharging the capacitor in some of the memory cells having the transistor turned on by the second threshold voltage.

16. The method as recited in claim 13, wherein the step (C) includes the step of (C-4) refreshing all of the memory cells.

17. The method as recited in claim 16, wherein the plurality of the memory cells are arranged in a matrix by using a number of word lines and bit lines and the step (C) is carried out in a row-by-row basis.

18. The method as recited in claim 17, wherein the capacitor is a coupling capacitor.

19. A method for operating a non-volatile dynamic random access memory (NVDRAM) device including a plurality of memory cells, each cell having a capacitor and a transistor having a floating gate, comprising the steps of:

(A) removing electrons in the floating gate of the memory cell storing a logic HIGH datum;

(B) discharging the capacitor by supplying gate of the transistor in all of the memory cells with a second threshold voltage; and (C) repeating the steps (A) to (B) until all of the capacitors is discharged.

20. The method as recited in claim 19, wherein the step (A) includes the steps of:

(A-1) supplying a gate of the transistor in all of the memory cells with a negative voltage;

(A-2) supplying a plate of the capacitor in the memory cells with voltage level of a logic HIGH datum; and (A-3) selectively moving electrons in the floating gate to the capacitor storing the logic HIGH datum.

21. The method as recited in claim 20, wherein the step (B) includes the steps of:

(B-1) supplying the gate of the transistor with a second threshold voltage; and (B-2) discharging the capacitor in some of the memory cells having the transistor turned on by the second threshold voltage.

22. The method as recited in claim 21, wherein the step (B) includes the steps of (B-c) refreshing the memory cell.

23. The method as recited in claim 22, wherein the step (B) is carried out row-by-row.

24. The method as recited in claim 23, wherein the capacitor is a coupling capacitor.

* * * * *